US008895432B2

(12) United States Patent
Chang et al.

(10) Patent No.: US 8,895,432 B2
(45) Date of Patent: Nov. 25, 2014

(54) METHOD OF FABRICATING A SELF-ALIGNED BURIED BIT LINE FOR A VERTICAL CHANNEL DRAM

(71) Applicants: Chorng-Ping Chang, Saratoga, CA (US); Bingxi Wood, Stanford, CA (US); Er-Xuan Ping, Fremont, CA (US)

(72) Inventors: Chorng-Ping Chang, Saratoga, CA (US); Bingxi Wood, Stanford, CA (US); Er-Xuan Ping, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/986,499

(22) Filed: May 8, 2013

(65) Prior Publication Data

US 2013/0320542 A1 Dec. 5, 2013

Related U.S. Application Data

(60) Provisional application No. 61/689,266, filed on May 31, 2012.

(51) Int. Cl.
*H01L 21/768* (2006.01)
*H01L 23/498* (2006.01)

(52) U.S. Cl.
CPC ........ *H01L 21/76889* (2013.01); *H01L 23/498* (2013.01)
USPC .......................................... 438/653; 257/751

(58) Field of Classification Search
USPC .......................................... 257/751; 438/653
See application file for complete search history.

(56) References Cited

U.S. PATENT DOCUMENTS

| | | | |
|---|---|---|---|
| 5,874,760 A * | 2/1999 | Burns et al. | 257/315 |
| 5,926,715 A | 7/1999 | Fan et al. | 438/305 |
| 6,072,209 A | 6/2000 | Noble et al. | 257/296 |
| 6,551,874 B2 | 4/2003 | Pohl et al. | 438/243 |
| 6,566,187 B1 * | 5/2003 | Willer et al. | 438/239 |
| 6,734,484 B2 | 5/2004 | Wu | 257/301 |
| 7,223,678 B2 * | 5/2007 | Noble et al. | 438/587 |
| 2007/0051994 A1 * | 3/2007 | Song et al. | 257/296 |
| 2010/0013005 A1 * | 1/2010 | Roesner et al. | 257/329 |
| 2010/0165693 A1 | 7/2010 | Ohgami | 365/51 |
| 2011/0080766 A1 | 4/2011 | Chang | 365/148 |
| 2011/0151674 A1 | 6/2011 | Tang et al. | 438/715 |
| 2011/0176356 A1 | 7/2011 | Kajigaya | 365/149 |
| 2011/0261631 A1 | 10/2011 | Yoshida | 365/189.11 |
| 2013/0161818 A1 * | 6/2013 | Han | 257/751 |
| 2014/0054775 A1 * | 2/2014 | Kim et al. | 257/751 |

OTHER PUBLICATIONS

Colinge, J., "Multiple-gate SOI MOSFETS." Solid-State Electronics. 2004. pp. 897-905.
Walder, et al., "FT-IR Measurement of PSG and BPSG Films, Part I: IR Principles and K-matrix Approach." Thermo Scientific. Application Note: 50637 (4 pages). 2008.
Wu, et al., "Symmetric Vertical-Channel Nickel-Salicided Poly-Si Thin-Film Transistors With Self-Aligned Oxide Overetching Structures." IEEE Transactions on Electron Devices, vol. 58, No. 7. 2011. pp. 2008-2013.

* cited by examiner

*Primary Examiner* — Thao P Le
(74) *Attorney, Agent, or Firm* — Shirley L. Church Esq.

(57) ABSTRACT

A method of fabricating a self-aligned buried bit line in a structure which makes up a portion of a vertical channel DRAM. The materials and processes used enable self-alignment of elements of the buried bit line during the fabrication process. In addition, the materials and processes used enable for formation of individual DRAM cells which have a buried bit line width which is 16 nm or less.

12 Claims, 4 Drawing Sheets

METHOD OF FABRICATING A SELF-ALIGNED BURIED BIT LINE FOR A VERTICAL CHANNEL DRAM

BACKGROUND OF THE INVENTION

1. Technology Field

The present application is related to a particularly compact structure comprising a plurality of vertical channel DRAM cells, with each cell having a self-aligned buried bit line, and to a method of fabricating this compact structure. The present application was filed simultaneously with a related application which relates to fabrication of a gate-all-around word line for a vertical channel DRAM. The related application number is 61/689,238, filed on May 31, 2012 and is entitled: "Method Of Fabricating A Gate-All-Around Word Line For A Vertical Channel Dram". This related application is hereby incorporated by reference in its entirety.

2. Description of the Background

This section describes background subject matter related to the disclosed embodiments of the present invention. There is no intention, either express or implied, that the background art discussed in this section legally constitutes prior art.

Technology for producing DRAM structures having a 30 nm to 40 nm half pitch has recently been described in the semiconductor processing industry. As part of the constant desire for shrinking the size of device structures, we have been developing vertical channel DRAM structures including trench feature sizes in the range of 5 nm to 10 nm. However, to achieve this goal, it is necessary to develop a different overall device design and a new process for manufacturing the device, both from a point of fabrication feasibility and with an eye on performance stability and reliability.

DRAM devices of a kind currently known in the industry are typically part of an integrated circuit structure and include a bit line and a word line which extends orthogonally relative to the bit line, with the bit line being electrically isolated from the word line. The present invention makes use of these features, but in a unique overall structure comprising a plurality of vertical channel DRAM cells which allows for a smaller feature size and more compact individually-addressable DRAM cells.

SUMMARY

The present invention relates to an overall matrix for the location of individually-addressable DRAM cells and to a method of creating a buried bit line within that overall matrix.

The overall matrix of the vertical channel DRAM includes a plurality of buried bit lines and electrically isolated, buried word lines in a solid structure which is typically quadrilateral, where the sides of the structure are frequently at right angles to provide for efficient manufacturing, packaging and placement relative to other active devices which make use of the DRAM. Previous DRAM architecture typically made use of a bit line and a word line which were located at various other angles with respect to each other. While it is possible to create the buried bit lines of the present invention to be at an angle other than a right angle with respect to the word lines within the DRAM cells, this is a less preferred embodiment. When the bit lines and word lines are located at right angles, this enables better plasma processing of the materials which make up the architecture, and closer packing of the dram cells in the cell array. If required for a particular application, a DRAM matrix structure may be varied in terms of exterior surface shape of the array. For purposes of discussion herein, the cells within the array have sidewalls which are at right angles. In addition, the exterior overall matrix (array) of cells advantageously has side walls which are at right angles with respect to each other.

For a DRAM cell array, vertical channel transistors can provide area scaling advantage of about 33%. In the past, all contacts for the overall matrix of cells were made from the top of the array and this required additional space. A buried bit line (BBL) with sidewall connections on the exterior surfaces of the cell array is key to provide the most efficient production and functionality for vertical channel transistors for DRAM applications. To be able to use such outside sidewall connections for a cell array, there must be low line resistance along the bit lines. We use a self-aligning process flow to fabricate the BBL with low resistivity, this reduces processing costs and is advantageous for future scaling of banks of DRAM cells.

The starting substrate is typically a regular bulk Si (100) substrate. The method of fabrication used for the present invention requires that the materials and processes used to form the DRAM cell have particular compatibility, as will be discussed subsequently herein.

The starting silicon substrate is first etched to provide parallel trenches within the silicon substrate, where an individual trench has a width critical dimension (CD) of 16 nm or less, with the spacing between trenches also being 16 nm or less, by way of example and not by way of limitation. The depth of the silicon trench is approximately 200 nm. In view of the sizing of the features of the DRAM cell array, a dry plasma etch is recommended for creation of the trenches in the substrate.

The trenches are created by first applying a hard mask blanket of silicon nitride or oxide/nitride dielectric HM. The silicon nitride is applied using low pressure chemical vapor deposition (LPCVD) or plasma enhanced CVD (PECVD). Due to the feature size of the individual dram cells, the finished thickness of a patterned silicon nitride hard mask is typically about 50 nm, but may vary for a different hard masking material.

The trench pattern in the hard mask is frequently created using a material referred to as APF. APF is a strippable amorphous carbon masking material, the residue of which can be easily removed from a patterned silicon nitride hard mask by etching the amorphous carbon using an oxygen-comprising plasma. To provide pattern features of about 20 nm or less in a silicon nitride hard mask, a thin (about 120 nm or less in thickness) chemically amplified photoresist sensitive to DUV or EUV radiation is patterned, and the patterned photoresist is used to transfer the trench pattern into the amorphous carbon masking film. The process for deposition of an amorphous carbon masking material film is typically a CVD process. The apparatus and process for deposition of an amorphous carbon sacrificial hard masking material are commercially available from Applied Materials, Inc., Santa Clara, Calif.

Etching of the silicon trenches is carried out using a plasma etching technique. One plasma feed gas composition which produces good results for etching a silicon nitride hard mask is an $SF_6/CH_4/N_2/O_2$ mixture, by way of example and not by way of limitation. Subsequent to patterning the hard mask, the trenches are etched in the silicon substrate using a plasma gas composition such as $Cl_2/HBr/He/O_2$ plasma, by way of example and not by way of limitation. After pattern etching of the hard mask, approximately 50 nm of patterned silicon nitride remains on the silicon surface.

After etching of the trench pattern, to provide for dimensional control of the device structure, it is helpful to use chemical mechanical polishing (CMP) to obtain a flat, planar surface on the device structure. To be able to CMP the surface of the columns of silicon after the pattern etching, an oxide is applied to fill the trenches, to protect and stabilize the rows of etched silicon trenches during planarization. The oxide fill needs to be void-free. The oxide fill is typically carried out using an FCVD process. FCVD (flowable CVD) refers to a method which makes use of a CVD or ALD deposition technique to fill the trenches from the bottom toward the top. The apparatus and the materials necessary to carry out FCVD are commercially available from Applied Materials, Inc. of Santa Clara Calif. This oxide fill provides excellent results, but is mentioned as one possibility, and not by way of limitation.

Subsequent to the oxide fill, a chemical mechanical polishing process (CMP) of the kind well known in the art is used to provide a level upper surface on the substrate. The CMP process is carried out until the upper surface of the residual silicon nitride layer overlying the silicon rows (the sidewalls of the trenches) is reached.

Following the CMP process, an oxide etch back is carried out, where about 170 nm of oxide is removed. The oxide remaining in the bottom of the trenches is then about 80 nm in depth. While it is possible to use a wet etch process which is designed to avoid stiction between silicon columns, a dry etch typically provides advantages. In a recommended technique, a dry etch process employs a hydrogen-comprising source which is frequently ammonia ($NH_3$) and a fluorine-comprising source such as nitrogen trifluoride ($NF_3$), which are combined in a remote plasma system (RPS). The plasma flows from the RPS into an etch processing chamber to provide the oxide etch back. Typically the relative flow rates of the precursors used to form the plasma etchant are adjusted so that a ratio of the atomic % of hydrogen present in the plasma relative to the atomic % of fluorine ranges from about 1:1 to about 20:1, so that a smooth etched surface is obtained, where the average surface roughness is typically about 1 nm to 2 nm Ra. This dry etch process and an apparatus for carrying out the process are commercially available from Applied Materials, Inc. of Santa Clara, Calif.

Following the oxide etch back, a silicon nitride layer ranging in thickness from about 2.5 nm to about 3.5 nm is deposited over the exposed surfaces of the substrate using LPCVD. Following the silicon nitride deposition, a directional, anisotropic, etch of the silicon nitride layer is carried out. After this etch, about 40 nm of silicon nitride remains on the top of the trench sidewalls, about 3±0.5 nm remains on the sidewalls of the trenches, and 0 nm remains at the bottom of the trenches, due to removal of about 4 nm (3 nm plus a 33% overetch). About 1 nm of silicon oxide is removed from the bottom of the trench during the etch back step.

After the anisotropic etch of the silicon nitride, an isotropic, silicon oxide etch is carried out using an etchant which has a selectivity of about 30:1 or greater of oxide relative to nitride. A dry etch is typically used because of the dimensions of the trenches and the desire to avoid stiction. About 40 nm of oxide is removed from the bottom of the trench. Simultaneously, the 2.5 nm to 3.5 nm thick layer of oxide which is present under the lower end of the silicon nitride sidewall is removed, to expose the silicon sidewall beneath. The remaining oxide at the bottom of the trench is about 40 nm in thickness.

One advantageous plasma etchant which may be used during the isotropic silicon oxide etch is an $NH_3/NF_3$ plasma previously described, which provides an advantageously smooth surface. This etch process is commercially available from Applied Materials, Inc. of Santa Clara, Calif. and is frequently referred to as "Siconi".

Conformal doping of the exposed silicon surfaces beneath the silicon nitride sidewall layer may be carried out using a dopant such as phosphorous (P) or arsenic (As). The doping is typically applied using SEG epi with in-situ P or As, or using plasma doping, where the dopant may be As or P, or using PSG oxide doping. The conformal doping is followed by Rapid Thermal Annealing (RTA) at a temperature of about 1000° C. for about 30 seconds, to provide outward, uniform distribution of the dopant into the silicon sidewall from each direction toward the center of the silicon sidewall. The uniformly doped area functional doping density is typically greater than $5.E+19$ cm$^{-3}$, and is frequently in the range of $1.E+20$ cm$^{-3}$. Subsequently, the surfaces of the patterned structure are cleaned, using a dry HF etch or the Siconi process previously described, by way of example and not by way of limitation. When the SEG with in-situ P or As is used to apply the dopant, it is not necessary to use a clean up step.

After the surface cleaning, a metal silicide is formed to provide conductive contacts for the bit line. To form the metal silicide, about 3 nm of Co metal or another metal selected from the group consisting of Co, Pt, Ni—Pt, Ti, Er, or combinations thereof, is deposited by a CVD technique over the interior surfaces of the patterned trenches; this is followed by ALD deposition of about 5 nm of TiN. Cobalt has been found to work particularly well when used to form the metal silicide. The TiN provides a metal cap to protect the cobalt metal during an RTA which is used to form the metal silicide. In one embodiment, a two step RTA is used to create the silicide, where the first RTA is carried out at about 500° C. for about 10 seconds to about 30 seconds to form $CO_2Si$; un-reacted Co and the TiN metal cap are then stripped using techniques known in the art, typically wet stripping; and a second RTA is carried out at about 850° C. for a time period of about 20 seconds to about 40 seconds to form $COSi_2$, which provides reduced sheet resistance along the bit line. Full silicidation of the exterior surfaces of the doped regions of the silicon columns can be achieved in this manner.

Since the bit line contacts are doped, the only metal contacts necessary for the bit line are on the outside metal silicide layer which is in contact with the doped regions of the block DRAM cell array.

Residual metals present on the exterior silicon sidewall surface and, optionally, the 3 nm silicon nitride sidewall layer above the metal silicide area may then be stripped from the exterior of the silicon sidewalls using an RIE process of the kind previously described with respect to the removal of silicon nitride. The decision about whether the silicon nitride sidewall layer will be stripped at this time depends on overall process integration with a word line which will subsequently be formed as part of the DRAM.

Finally, an FCVD oxide fill and cure, of the kind described above are carried out, to stabilize the structure, followed by CMP, stopping on nitride, to complete a buried bit line structure.

DETAILED DESCRIPTION OF EXEMPLARY EMBODIMENTS

Figure 1:
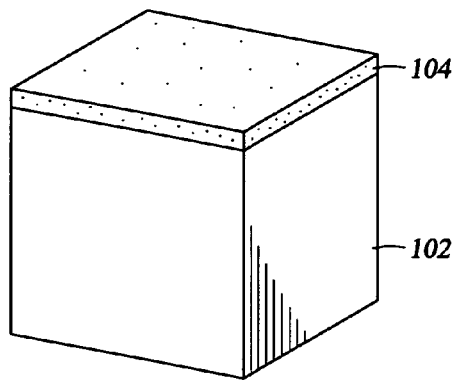
FIG. 1 shows a schematic drawing of a structure 100 with a silicon substrate 102 and with a silicon nitride layer 104 overlying silicon substrate 102.

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

The present invention relates of an overall matrix for the location of individually-addressable DRAM cells and to a method of creating a buried bit line within that overall matrix. In a related invention, the structure described with respect to the buried bit line is further processed to create a completed DRAM device structure, including a plurality of buried bit lines with accompanying electrically isolated buried word lines, where an exterior upper surface of the structure is ready for capacitor application to each individually addressable DRAM cell. The priority patent application for the present invention and the priority patent application for the related invention were filed simultaneously to provide the same priority date.

The overall matrix of the vertical channel DRAM includes a plurality of buried bit lines and electrically isolated, buried word lines in a solid structure which is typically quadrilateral, where the sides of the structure are frequently at right angles to provide for efficient manufacturing, packaging and placement relative to other active devices which make use of the DRAM. However, if advantageous for a particular application, the matrix structure may be varied in terms of exterior surface shape. For purposes of discussion herein, the overall matrix is a rectangular shape with sidewall corners being at right angles.

For a DRAM cell array, vertical channel transistors can provide an area scaling advantage of about 33%. Buried bit line (BBL) is key to enable such transistors for DRAM applications. We use a self-aligning process flow to fabricate a BBL with low resistivity, which may be advantageous for future scaling of banks of DRAM cells.

The starting substrate is a quality silicon bulk (100) wafer. The method of fabrication used for the present invention requires that the materials and processes used to form the DRAM cell have particular compatibility. For example, the materials used are selected based on etch rate when exposed to various etchants; ease of removal using planarizing techniques; relative coefficients of expansion during thermal processing; performance characteristics of dopants in the presence of materials to be doped; and the like. In the same manner, the processing conditions required for etching, doping, activation of dopants, planarization, metallization, and the like must be compatible with the combination of materials described. We want to provide an exemplary process which is compatible in this manner, and therefore are specifying a particular combination of materials and corresponding processing conditions. However, it is understood that one of skill in the art, in view of the present disclosure, will be able to recommend other materials and processing conditions which may be used. To aid in an understanding of the invention, we will mention additional materials and processing conditions which may be used. However, this is with the understanding that one skilled in the art will select a combination of other materials and processing conditions which are compatible in the manner in which the exemplary process is compatible.

A starting structure 100, is prepared by application of an upper surface layer of silicon nitride 104 over an underlying silicon substrate 102, as shown in FIG. 1. The starting structure 100 is etched through a patterning mask (not shown) to provide a parallel trench pattern in silicon nitride layer 104, which then serves as a hard mask for pattern etching of trenches into the underlying silicon substrate 102. The patterning mask is frequently created using a process referred to as APF, which makes use of a strippable amorphous carbon masking technology for transferring a patterned image into an underlying hard mask such as the silicon nitride hard mask described above. To provide for etching features of about 20 nm or lower. A thin (120 nm or less in thickness) chemically amplified photoresist sensitive to DUV or EUV radiation is patterned, and the patterned photoresist is used to transfer the trench pattern into the APF amorphous carbon masking film. The APF (Advanced Patterning Film) apparatus and processes for film deposition are available commercially from Applied Materials, Inc., Santa Clara, Calif. An individual trench has a width critical dimension (CD) of 16 nm, with the spacing between trenches also being 16 nm, so that a final individual dram cell which will eventually be produced will be 32 nm×32 nm, by way of example and not by way of limitation. The depth of a trench is typically about 200 nm. The layer of silicon nitride 104 is applied using low pressure chemical vapor deposition (LPCVD), a technique well known in the art. Due to the feature size of the individual dram cells, the thickness of the hard mask is typically in the range of about 50 nm, but may vary depending on the hard masking material used.

Figure 2:
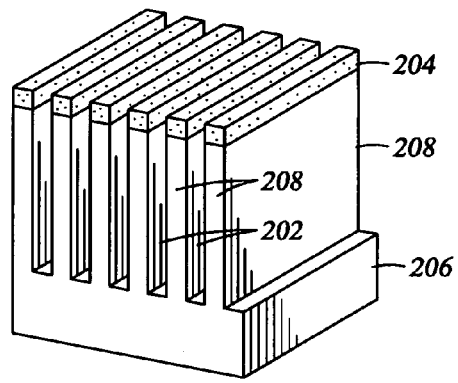
FIG. 2 shows a schematic drawing of a structure 200 which includes trenches 202 which have been etched through silicon nitride layer 104 and into the silicon substrate 102, leaving a silicon substrate base 206, silicon trench columns 208 having sidewalls 209 and overlying nitride layer caps 204.

Etching of the trenches is carried out using a plasma etching technique of the kind generally known in the art. One plasma feed gas composition which produces good results for etching a silicon nitride hard mask is an $SF_6/CH_4/N_2/O_2$ mixture, by way of example and not by way of limitation. Subsequent to patterning the hard mask, the trenches are etched in the silicon substrate using a plasma gas composition such as $Cl_2/HBr/He/O_2$ plasma, by way of example and not by way of limitation. After pattern etching using the silicon nitride hard mask, approximately 40 nm of patterned silicon nitride remains on the silicon surface. FIG. 2 shows the etched structure, where 204 represents the layer of patterned silicon nitride remaining, 208 represents the silicon columns created by the trench etching. The trenches between silicon columns 208 are identified by number 202, and 206 represents the silicon base present beneath etched trenches 202.

Figure 3:
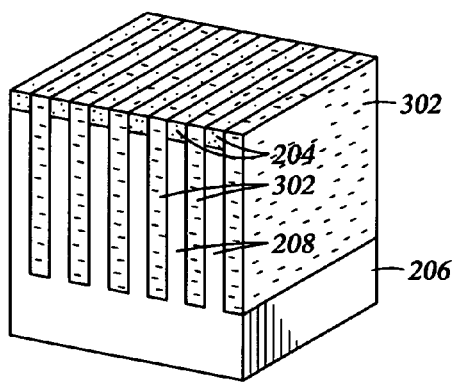
FIG. 3 shows a schematic drawing of a structure 300 which includes the silicon substrate base 206 with silicon nitride caps 204 and silicon trench columns 208 after a silicon oxide fill 302 has been applied to fill the interior of trenches 202.

After etching of the trench pattern, to obtain a level upper surface on the substrate, an oxide is applied to fill the trenches, protecting and stabilizing the rows of etched silicon columns 208. This is illustrated in FIG. 3, where 302 represents the oxide fill. The oxide fill is typically carried out using an FCVD process, where FCVD (flowable CVD) refers to a carbon-free material applied using a CVD technique, to fill the trenches from the bottom toward the top. The apparatus and materials necessary to carry out FCVD are commercially available from Applied Materials, Inc. of Santa Clara, Calif. This oxide fill method is an example and is not intended to limit the method of silicon oxide fill which may be used. FIG. 3 illustrates the structure 300 which represents oxide 302— filled rows of silicon columns 208.

Figure 4:
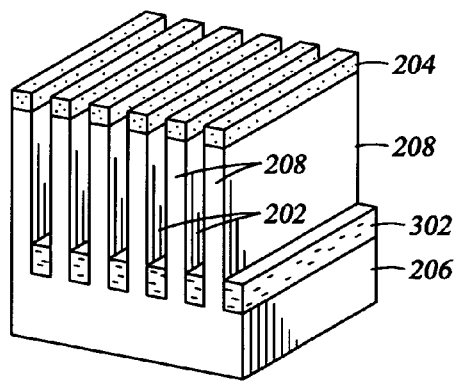
FIG. 4 shows a schematic drawing of a structure 400 which is produced from structure 300 after an etch back of the silicon oxide fill 302, so that a remaining portion of fill 302 is present only at the base of trenches 202.

Subsequent to the oxide fill, a chemical mechanical polishing process (CMP) of the kind well known in the art is used to provide a level upper surface on the structure 300. The CMP process is carried out until the upper surface of the residual silicon nitride layer 204 overlying the rows of silicon columns 208 are reached. Following the CMP process, an oxide etch back is carried out, where about 160 nm of oxide is removed from within the trenches 202. The Finished etched structure 400 is shown in FIG. 4, where the patterned layer of silicon nitride 204 is present on the upper surfaces of the silicon columns 208, and the remaining oxide fill 302 is present at the bottom of trenches 202 overlying silicon base 206. The oxide remaining in the bottom of the trenches 202 is then about 90 nm in height (deep). The oxide etch back may be carried out using a reactive ion etch (RIE) technique known in the art, where the etchant has a selectivity with respect to silicon nitride of about 10:1 or greater. Other techniques which may be used for removal of oxide include an etch process which employs a hydrogen-comprising source such as ammonia ($NH_3$) and a fluorine-comprising source of nitrogen, such as nitrogen trifluoride ($NF_3$), which are combined in a remote plasma system (RPS). The RPS system provides plasma flow into an etch processing chamber to provide the oxide etch back. One embodiment of this etching process is referred to as Siconi and is commercially available from Applied Materials, Inc. of Santa Clara, Calif. Typically the relative flow rates of the precursors used to form the plasma etchant are adjusted so that a ratio of the atomic % of hydrogen present in the plasma relative to the atomic % of fluorine ranges from about 1:1 to about 20:1, to provide a smoother etched surface, so that the average surface roughness is about 1 nm Ra to 2 nm Ra. While it may be possible to use a wet etchant to accomplish the oxide etch back, this is less desirable, due to the possibility of stiction between the sidewalls of the trenches.

Figures 5, 6:
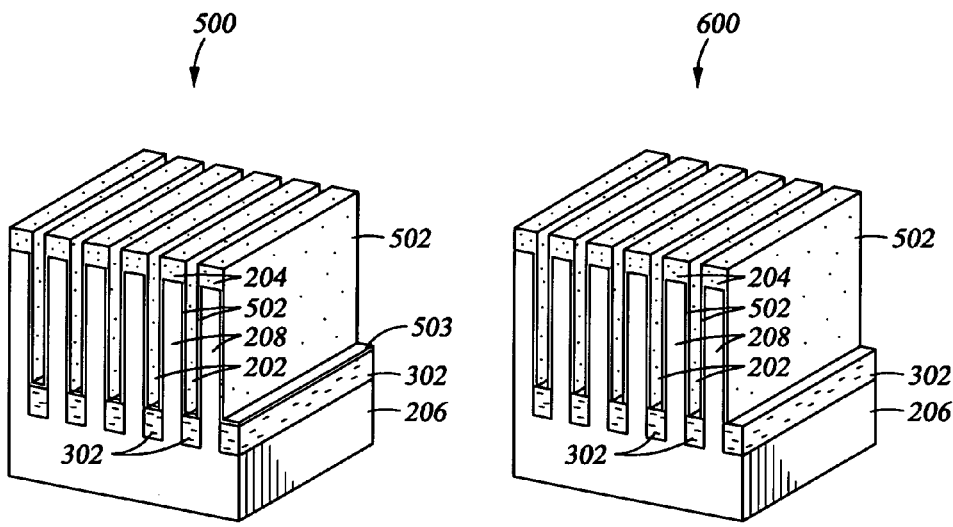
FIG. 5 shows a schematic drawing of a structure 500 which is produced from structure 400 by deposition of additional silicon nitride to form a silicon nitride spacer wall 502, with residual silicon nitride layer 503 at the bottom of trench 202.
FIG. 6 shows a schematic drawing of a structure 600 which is produced from structure 500, where anisotropic etching has been used to remove silicon nitride layer 503 from the bottom of trenches 202.

Following the oxide etch back, a silicon nitride layer ranging in thickness from about 2.5 nm to about 3.5 nm is deposited over the exposed surfaces of the substrate using LPCVD. This is illustrated in FIG. 5, where an additional amount of silicon nitride is added to the patterned silicon nitride layer at the top of the rows of silicon columns 208, and is also deposited as a layer 502 on the outer surfaces of the silicon columns 208 sidewalls. A silicon nitride layer 503 also deposits over the surface of oxide fill 302. Following the silicon nitride deposition, a directional, anisotropic, etch of the silicon nitride layer is used to remove about 4 nm of material, including the 2.5 to 3.5 nm of the silicon nitride layer 503 which was deposited at the bottom of the trenches; this is illustrated in structure 600 of FIG. 6. About 1 nm of silicon oxide fill 302 is also removed from the trench during the removal of silicon nitride which had deposited during the LPCVD. Typically, after the silicon nitride layer etch, the remaining silicon nitride thickness on the upper surfaces of the trench walls is about 40 nm, and the silicon nitride thickness on the sidewalls of the trenches ranges from about 3±0.5 nm. No silicon nitride remains at the bottom of the trenches, due to removal of the 4 nm (3 nm plus a 33% over etch). The plasma etchant should have a selectivity for silicon nitride relative to silicon oxide which is about 5:1 and an exemplary etchant would be similar to that described above for etchant of the silicon nitride hard mask or might be an etchant comprising $CHF_3/CF_4$.

Figures 7, 8:
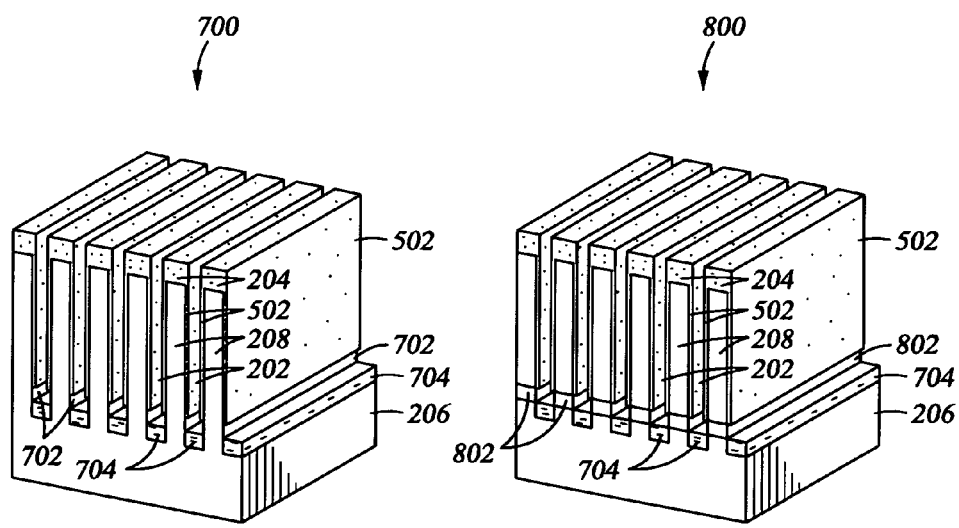
FIG. 7 shows a schematic drawing of a structure 700 which is produced from structure 600, where anisotropic etching is continued to etch back oxide layer 302, creating a narrow area of exposed silicon column surface 702 beneath silicon nitride spacer wall 502. In doing this, a reduced thickness oxide layer 704 is created at the bottom of trench 202, overlying silicon substrate base 206.
FIG. 8 shows a schematic drawing of a structure 800 which is produced from structure 700, where a dopant has been applied through the exposed silicon surface 702 to form doped areas 802 which extend through the interior of silicon columns 208.

FIG. 7 illustrates a structure 700 which is created after an isotropic etch of the silicon oxide, which is carried out to remove a carefully controlled amount of silicon oxide, to a depth of about 40 nm from the top of oxide layer 302, while simultaneously removing oxide overlying the silicon column 208 sidewalls beneath silicon nitride layer 502. This creates a layer of oxide 704 which begins about 40 nm beneath the bottom of silicon nitride layer 502, with the sidewalls of silicon column 208 exposed beneath the silicon nitride layer 502 to that depth. The isotropic etch is typically carried out using a plasma etchant which has a silicon oxide etch selectivity of about 30:1 or greater for silicon oxide relative silicon nitride.

One advantageous technique of removing any residual oxide which remains on the generally exposed silicon column 208 surface beneath silicon nitride layer 502 by employing an $NH_3/NF_3$ plasma which provides a particularly smooth etched surface. This etching technique is commercially available from Applied Materials, Inc, of Santa Clara, Calif., as was referred to above as a "Siconi" clean. After the oxide etching and the residue cleaning, the remaining oxide layer 704 remaining in the bottom of the trenches 202 is about 40 to 50 nm in thickness. This non-directional etch may be carried out using a liquid etchant, but this may cause stiction between the silicon column 208 sidewalls, depending on the etch conditions and the liquid etchant selected.

Conformal doping of the exposed silicon column sidewalls 702 is then carried out. The dopant used is typically phosphorous or arsenic. FIG. 8 shows the presence of conformal doping 802, which typically comprises either phosphorous P3i or PSG, and which ranges in original thickness from about 3 nm to about 5 nm. The conformal doping 802 is advantageously formed using an in-situ SEG epi with phosphorus or arsenic, but may also be formed using a CVD plasma containing the dopant or by application of a doped oxide, for example and not by way of limitation. The conformal doping is followed by Rapid Thermal Annealing (RTA) at a temperature of about 1000° C. for about 30 seconds, to provide outward, uniform distribution of the dopant into the silicon sidewall from each direction toward the center of the silicon sidewall. The uniformly doped area functional doping density is typically greater than $5.E+19$ $cm^{-3}$, and is frequently in the range of $1.E+20$ $cm^{-3}$. Subsequently, the surfaces of the patterned structure are cleaned, using a dry HF etch or the Siconi process previously described, by way of example and not by way of limitation. When the SEG with in-situ P or As is used to apply the dopant, it is not necessary to use a clean up step.

Figure 9:
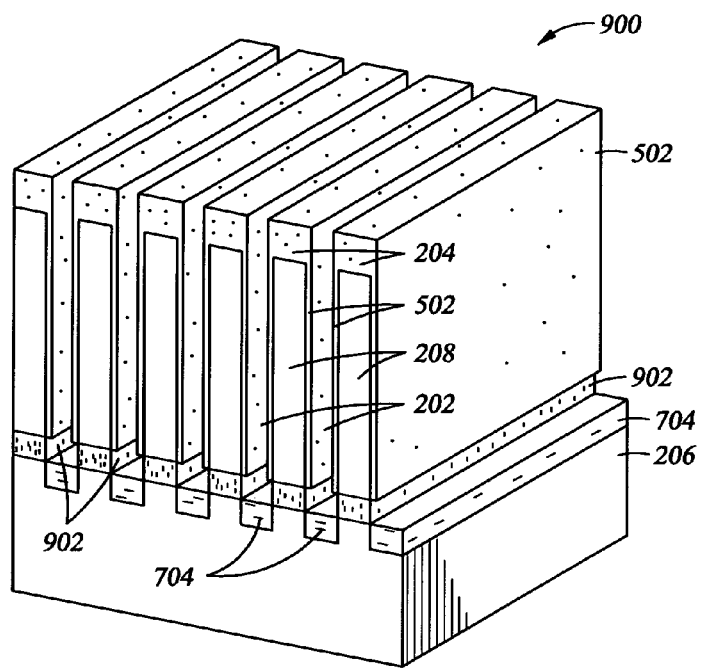
FIG. 9 shows a schematic drawing of a structure 900 which is produced from structure 800, where a metal silicide layer 902 has been produced over the exposed surface areas of the doped areas 802.

After the surface cleaning, a metal silicide is formed to function as an electrical connection surface for the buried bit line. The metal may be selected from the group consisting of Co, Pt, Ni—Pt, Ti, Er, or combinations thereof, and is typically deposited by a CVD technique over the interior surfaces of the patterned trenches; this is followed by ALD deposition of about 5 nm of a TiN barrier layer, by way of example and not by way of limitation. Cobalt has been found to work particularly well when used to form the metal silicide. The TiN provides a metal cap to protect the cobalt metal during an RTA which is used to form the metal silicide. In one embodiment, a two step RTA is used to create the silicide, where the first RTA is carried out at about 500° C. for about 10 seconds to about 30 seconds to form $Co_2Si$; this is followed by removal of un-reacted cobalt and the Tin metal cap using wet stripping by techniques known in the art; and, a second RTA is carried out at about 850° C. for a time period of about 20 seconds to about 40 seconds to form $COSi_2$, which provides reduced sheet resistance along the bit line. Full silicidation of the exterior surfaces of the doped regions of the silicon columns can be achieved in this manner, to provide electrical contact surfaces. The structure formed is shown in FIG. 9, where 902 represents the contact metal silicide layer, which is present at the base of each silicon column 208 sidewall.

Figure 10:
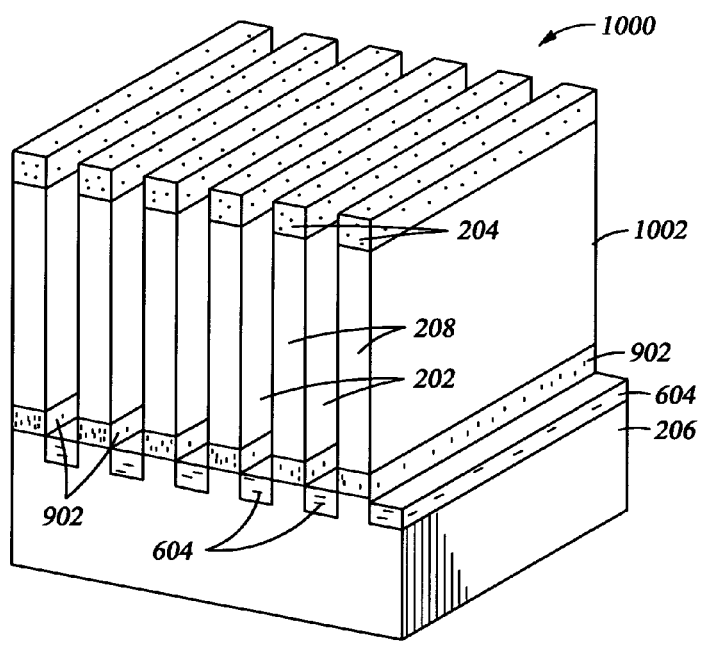
FIG. 10 shows a schematic drawing of a structure 1000 which may be produced from structure 900 by isotropic etching to remove the silicon nitride spacer walls. This process step is optional at this point in time and may be carried out later as a part of process integration into the word line formation process.

Subsequent to the creation of metal silicide layer 902, the protective silicon nitride layer 502 present on the exterior of silicon sidewalls 209 may be removed using a plasma etching process of the kind previously described herein with respect to silicon nitride removal. This is an optional step, which depends on the integration of the bit line formation method with a method of word line formation in the DRAM structure. FIG. 10 illustrates a structure 1000 which is formed after removal of the protective silicon nitride layer 502.

Figure 11:
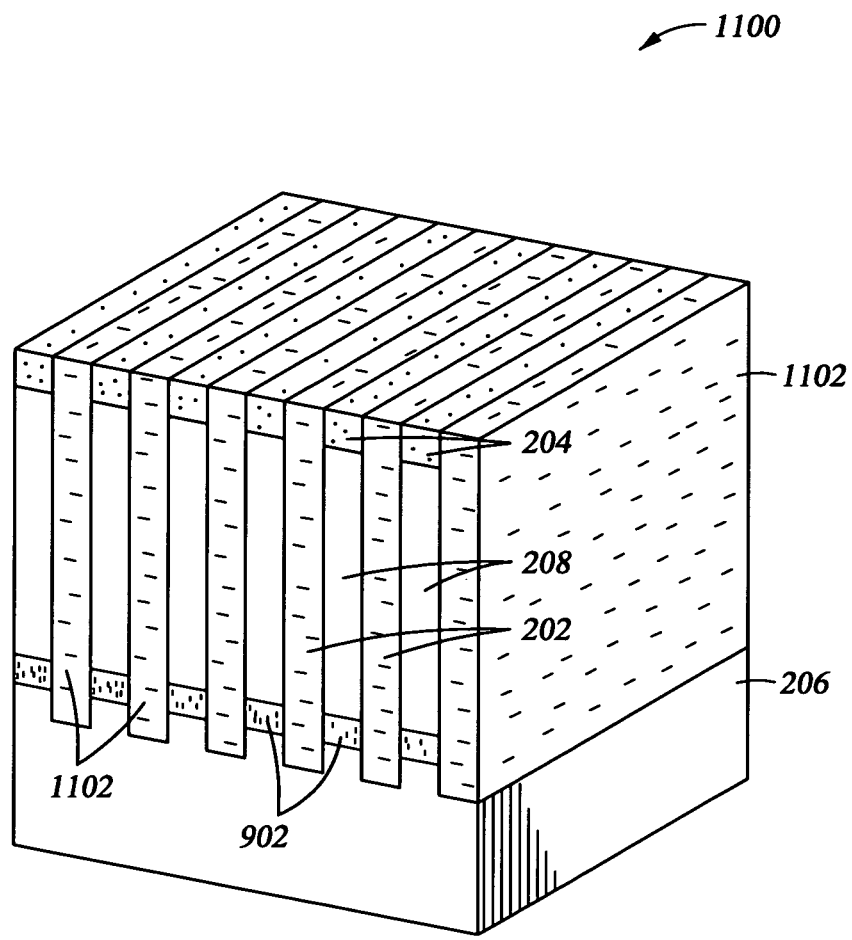
FIG. 11 shows a schematic drawing of a completed buried bit line structure 1100, where an oxide 1102 has been applied to fill the trenches 202. As discussed above, depending on process integration, the silicon nitride spacer walls 502 shown in FIG. 9 may be present over silicon columns 208.

Finally, an FCVD oxide fill of the kind previously described herein may be used to complete a buried bit of the kind which is illustrated in FIG. 11, where the oxide fill 1102 protects the buried bit line metal silicide electrical contact area 902 line, awaiting further processing to form a completed semiconductor device structure.

The above-described exemplary embodiments are not intended to limit the scope of the present invention, as one skilled in the art can, in view of the present disclosure, expand such embodiments to correspond with the subject matter of the invention claimed below.

We claim:

1. A method of fabricating a self-aligned buried bit line in a structure which makes up a portion of a vertical channel DRAM, comprising:
 a) blanket depositing an inorganic hard masking material which serves as both an electrical insulator and a barrier layer over a silicon substrate surface;
 b) patterning said inorganic hard masking material in a manner which permits etching of feature sizes in the range from 5 nm to 16 nm;
 c) pattern etching a plurality of trenches into said silicon substrate;
 d) filling said trenches with a dielectric material;
 e) planarizing an upper surface of filled trenches, stopping on an upper surface of said hard masking material;
 f) etching said dielectric material present within said trenches, to leave a dielectric layer having a controlled thickness at a bottom of each trench;
 g) depositing a protective hard masking material layer on surfaces of a structure created in step f); followed by
 h) anisotropically etching said protective hard masking material layer to remove the portion of said layer present at the bottom of said trenches;
 i) isotropically etching additional dielectric material off the upper surface of the dielectric material at the bottom of said trenches, and simultaneously a side wall surface of silicon columns present between said trenches, to create a gap of exposed silicon surface on said silicon column sidewalls, between the bottom edge of said hard masking material and the upper surface of said dielectric layer at a bottom of said trenches;
 j) inserting a dopant into said exposed silicon surfaces;
 k) rapid thermal annealing at a temperature ranging from about 950° C. to about 1,000° C.;
 l) cleaning residual off the exposed silicon surfaces and adjacent surfaces;
 m) applying a metal layer selected from the group consisting of Co, Pt, Ni—Pt, Ti, Er, and combinations thereof, over said exposed silicon surfaces using CVD or ALD;
 n) applying a metal-comprising barrier layer over said metal layer using ALD;
 o) forming a metal silicide using at least one rapid thermal annealing of said metal layer at a temperature ranging from about 300° C. to about 850° C.; and
 p) stripping of residual metal-comprising materials from said metal silicide and other adjacent surfaces.

2. A method in accordance with claim 1, wherein said rapid thermal annealing of said metal layer is carried out in two steps in which said first rapid thermal annealing is carried out at a temperature ranging between about 300° C. and about 650° C., and wherein said second rapid thermal annealing is carried out at a temperature ranging between about 400° C. and about 850° C.

3. A method in accordance with claim 2, wherein residual metal-comprising material is stripped off said metal silicide surface and adjacent surfaces subsequent to said first thermal annealing and prior to said second thermal annealing.

4. A method in accordance with claim 1, wherein, subsequent to step p) remaining portions of said protective hard masking material deposited in step g) are removed.

5. A method in accordance with claim 1, wherein, subsequent to step p), an additional step q) is carried out in which a layer of dielectric material is deposited over said structure to fill said trenches.

6. A method in accordance with claim 5, wherein, subsequent to step q), said layer of dielectric material is planarized.

7. A method in accordance with claim 4, wherein, subsequent to step p), a step q) is carried out in which a layer of dielectric material is deposited over said structure to fill said trenches.

8. A method in accordance with claim 7, wherein, subsequent to step q), said layer of dielectric material is planarized.

9. A method in accordance with claim 1, including an additional step in which said inorganic hard masking material deposited in step a) is planarized using a chemical mechanical polishing step prior to implementation of step b).

10. A method in accordance with claim 1, wherein said inorganic hard masking material is silicon nitride, said dielectric material is silicon oxide, said dopant comprises phosphorus, arsenic, or a combination thereof, said metal contact is formed from cobalt, and said barrier layer is formed from titanium nitride, so that the processing steps performed will produce self-aligned elements within said buried bit line structure.

11. An article produced by a method comprising the steps in claim 1.

12. An article produced by a method comprising the steps in claim 10.

* * * * *